United States Patent [19]

Strolle et al.

[11] Patent Number: 5,805,242
[45] Date of Patent: Sep. 8, 1998

[54] CARRIER INDEPENDENT TIMING RECOVERY SYSTEM FOR A VESTIGIAL SIDEBAND MODULATED SIGNAL

[75] Inventors: Christopher Hugh Strolle, Glenside, Pa.; Steven Todd Jaffe, Freehold, N.J.

[73] Assignee: Thomson Consumer Electronics, Inc., Indianapolis, Ind.

[21] Appl. No.: 704,787

[22] PCT Filed: Mar. 13, 1995

[86] PCT No.: PCT/US95/03131

§ 371 Date: Sep. 6, 1996

§ 102(e) Date: Sep. 6, 1996

[87] PCT Pub. No.: WO95/26074

PCT Pub. Date: Sep. 28, 1995

[30] Foreign Application Priority Data

Mar. 21, 1994 [GB] United Kingdom .................. 9405487

[51] Int. Cl.[6] .............................. H03D 1/24; H04L 27/16
[52] U.S. Cl. ......................... 348/726; 375/355; 375/321; 375/270; 455/204; 455/47; 348/426; 348/720; 348/369
[58] Field of Search .................................... 348/725, 726, 348/426, 720, 369; 455/204, 47; 375/355, 321; 329/357

[56] References Cited

U.S. PATENT DOCUMENTS

| | | | |
|---|---|---|---|
| 3,849,730 | 11/1974 | Ho ........................................... | 325/329 |
| 4,358,853 | 11/1982 | Qureshi ...................................... | 375/60 |
| 4,642,573 | 2/1987 | Noda et al. ................................ | 329/50 |
| 4,802,191 | 1/1989 | McGeehan et al. ....................... | 375/43 |
| 5,278,655 | 1/1994 | Jeong ..................................... | 358/191.1 |
| 5,287,180 | 2/1994 | White ..................................... | 348/484 |
| 5,311,546 | 5/1994 | Paik et al. ................................. | 375/14 |
| 5,363,408 | 11/1994 | Paik et al. ................................. | 375/39 |
| 5,386,239 | 1/1995 | Wang et al. ............................. | 348/472 |
| 5,398,073 | 3/1995 | Wei ......................................... | 348/487 |
| 5,550,596 | 8/1996 | Strolle et al. ........................... | 348/607 |
| 5,703,905 | 12/1997 | Langberg ................................. | 375/232 |
| 5,706,057 | 1/1998 | Strolle et al. ........................... | 348/426 |

OTHER PUBLICATIONS

Mueller and Muller, *Timing Recovery in Digital Synchronous Data Receivers*, IEEE Transactions on Communications, May 1976, pp. 516–531.

Liu et al., *Simulation and Implementation of US QAM–Based HDTV Channel Decoder*, IEEE Transactions on Consumer Electronics, Aug. 1993, pp. 676–682.

(List continued on next page.)

*Primary Examiner*—Mark R. Powell
*Assistant Examiner*—Uyen Le
*Attorney, Agent, or Firm*—Joseph S. Tripoli; Eric P. Herrmann; Ronald H. Kurdyla

[57] ABSTRACT

A television signal receiver for processing an HDTV signal transmitted in a vestigial sideband (VSB) format includes input complex filters shared by a timing recovery network (30) and a carrier recovery network (50). The filter network includes a pair of upper and lower band edge filters (20, 22) mirror imaged around the upper and lower band edges of the VSB signal for producing suppressed subcarrier AM output signals. The timing recovery network includes a phase detector (28, 38, 62) and responds to an AM signal derived from the two filters (via 26) for synchronizing a system clock (CLK). The carrier recovery network (50) also includes a phase detector (54, 60, 62, 64), and responds to outputs from one or both of the filters for producing an output error signal (Δ) representing a phase/frequency offset of the VSB signal. The error signal is used to reduce or eliminate the offset to produce a recovered baseband or near baseband signal. A subsequent equalizer eliminates any residual phase offsets in the recovered signal.

11 Claims, 2 Drawing Sheets

OTHER PUBLICATIONS

The Grand Alliance HDTV System Specification (Draft Document) submitted to the ACATS Technical Subgroup, as published in the 1994 Proceedings of the 48th Annual Broadcast Engineering Conf. Proceedings Mar. 20–24, 1994.

Jablon, *Joint Bling Equalization, Carrier Recovery, and Timing Recovery for High–Order QAM Signal Constella tions*, IEEE Transactions on Signal Processing, Jun. 1992, pp. 1383–1397.

Citta et al., *The Digital Spectrum Compatible HDTV Transmission System*, IEEE Transactions on Consumer Electronics, Aug. 1991, pp. 469–475.

Lee, Digital Communication, *Timing Recovery*, 1988 Kluwer Academic Publishers, pp. 561–581.

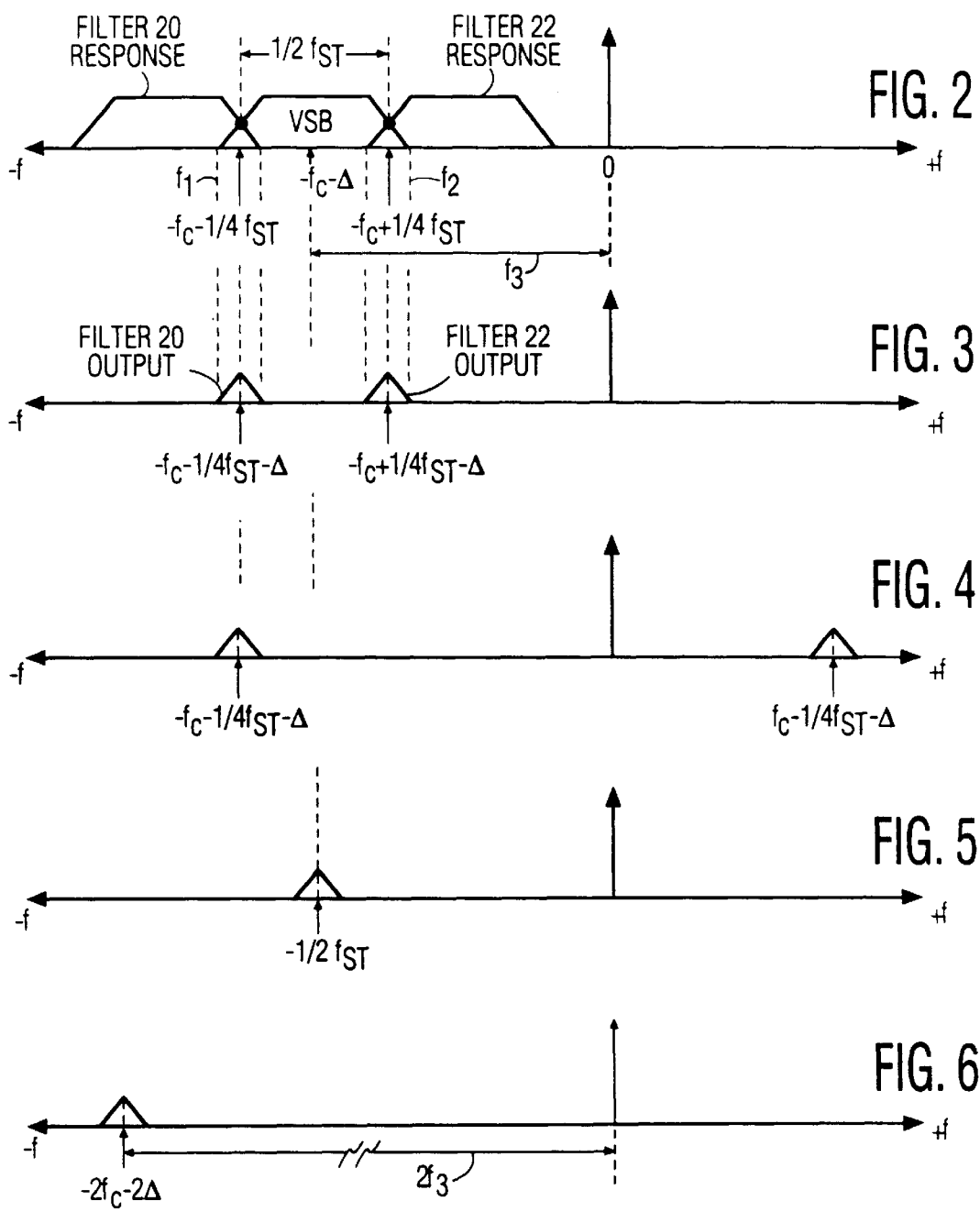

CARRIER INDEPENDENT TIMING RECOVERY SYSTEM FOR A VESTIGIAL SIDEBAND MODULATED SIGNAL

FIELD OF THE INVENTION

This invention concerns a digital signal processing system. In particular, the invention concerns a timing recovery system for use in a receiver of a vestigial side band (VSB) signal such as may be modulated with high definition television (HDTV) information, for example.

BACKGROUND OF THE INVENTION

The recovery of data from a VSB or a QAM (Quadrature Amplitude Modulated) signal at a receiver requires the implementation of three functions: timing recovery for symbol synchronization, carrier recovery (frequency demodulation) and equalization. Timing recovery is the process by which the receiver clock (timebase) is synchronized to the transmitter clock. This permits the received signal to be sampled at the optimum point in time to reduce the chance of a slicing error associated with decision-directed processing of received symbol values. Carrier recovery is the process by which a received RF signal, after being frequency shifted to a lower intermediate frequency passband, is frequency shifted to baseband to permit recovery of the modulating baseband information. Equalization is a process which compensates for the effects of transmission channel disturbances upon the received signal. More specifically, equalization removes intersymbol interference (ISI) caused by transmission channel disturbances. ISI causes the value of a given symbol to be distorted by the values of preceding and following symbols.

For QAM signals, timing recovery is usually the first function implemented in a receiver. The timing is recovered from either the intermediate passband signal or from a near-baseband signal, i.e., a baseband signal with a carrier offset that is corrected by the carrier recovery network. In either case, timing can be established prior to baseband demodulation.

A QAM signal conveying digital information is represented by a two-dimensional data symbol constellation defined by Real and Imaginary axes. In contrast, a VSB signal is represented by a one-dimensional data symbol constellation wherein only one axis contains quantized data to be recovered at a receiver. Timing recovery for a baseband VSB signal can be achieved using periodic synchronizing (sync) symbols or components. This technique is used by a terrestrial broadcast Grand Alliance HDTV system recently proposed for the United States. A significant drawback of this technique is that the use of such sync symbols reduces the payload capacity of the data transmission channel.

The Grand Alliance HDTV system employs a vestigial sideband (VSB) digital transmission format for transmitting a packetized datastream. This HDTV system is a proposed transmission standard that is under consideration in the United States by the Federal Communications Commission through its Advisory Committee of Advanced Television Service (ACATS). In this system, data is arranged as a sequence of data fields. Each field includes 313 segments: a field sync segment (which does not contain payload data) followed by 312 data segments. A sync component is associated with each data segment. A description of the Grand Alliance HDTV system as submitted to the ACATS Technical Subgroup on Feb. 22, 1994 (draft document) is found in the 1994 Proceedings of the National Association of Broadcasters, 48th Annual Broadcast Engineering Conference Proceedings, Mar. 20–24, 1994.

SUMMARY OF THE INVENTION

A disclosed timing recovery system, suitable for use with VSB signals, advantageously achieves timing recovery without reliance upon sync components. This is accomplished using band edge timing recovery with respect to a received VSB signal to develop double sideband amplitude modulated signals from which timing information is extracted. In an illustrated embodiment, a band edge filter network filters upper and lower band edges of the VSB signal. The disclosed system advantageously operates at the symbol rate, does not rely on a received signal containing bandwidth limiting synchronizing components to facilitate timing recovery, and is capable of achieving timing synchronism independent of a carrier offset when present.

In a disclosed embodiment, the filter network is a complex digital filter network with responses that are complementary to the frequency spectrum of the received VSB signal at band edges filtered by the filter network.

In accordance with a feature of the invention, the filter network is shared by a carrier recovery network for frequency shifting the received VSB signal toward baseband.

BRIEF DESCRIPTION OF THE DRAWINGS

FIGS. 2–6 illustrate amplitude versus frequency responses of signals associated with the operation of the system of FIG. 1.

DETAILED DESCRIPTION OF THE DRAWINGS

Figure 1:
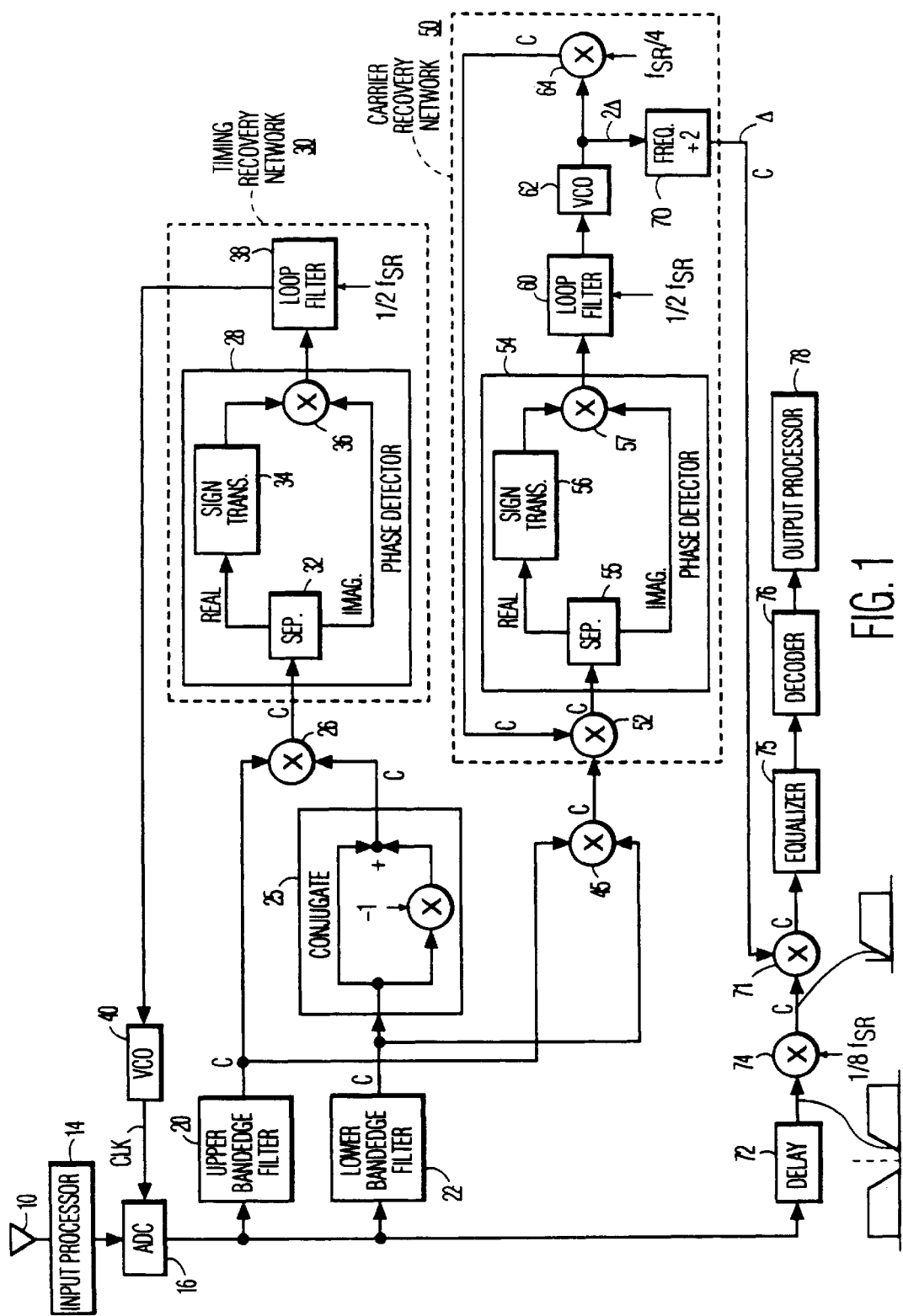
FIG. 1 is a block diagram of a portion of an advanced television receiver, such as a HDTV receiver, including a timing recovery system in accordance with the principles of the invention.

In FIG. 1, a broadcast VSB modulated HDTV analog signal received by an antenna 10 is processed by an input network 14 including RF tuning circuits, a double conversion tuner for producing an intermediate frequency passband suitable for conversion to digital form and appropriate gain control circuits, for example. The received VSB signal illustratively is an 8-VSB signal with a symbol rate of approximately 10.76 Msymbols/second occupying a conventional NTSC 6 MHz frequency spectrum, in accordance with the Grand Alliance HDTV specification. Specifically, the received VSB signal in this example is an 8-VSB signal having a one dimensional data constellation defined by the following eight data symbols:

$$-7\ -5\ -3\ -1\ 1\ 3\ 5\ 7$$

The Nyquist bandwidth for this system is nominally 5.38 MHz for example, with excess bandwidth nominally 0.31 MHz at each bandedge. The disclosed system may also be used for 16-VSB signals, for example.

The output signal from input processor 14 is converted from analog to digital form by an analog-to-digital converter 16, which operates at a sample rate of 2 samples/symbol. The received VSB signal may include a pilot component and has been demodulated by unit 14 so that the center of the 6 MHz band is nominally situated at 5.38 MHz. The frequency spectrum of this signal at the input of ADC 16 occupies a range of 2.38 MHz to 8.38 MHz. When timing synchronization is established, ADC unit 16 samples this signal at 21.52 MHz, which is twice the symbol rate. The pilot component, which represents the DC point of the original baseband pulse amplitude modulated (PAM) signal, is nominally situated at 2.69 MHz (the Nyquist frequency), which is ⅛ $f_{sr}$. In the following discussion $f_c$ is the carrier frequency of the transmitted signal (nominally 5.38 MHz), $f_{st}$ is the transmitted symbol frequency (10.76 Msymbols/sec, or four times the Nyquist frequency), and $f_{sr}$ is the receiver sampling frequency (21.52 Mhz).

At timing lock, $f_{sr}=2f_{st}$. At carrier lock when demodulation to baseband results, $f_c=¼ f_{sr}$.

The digital signal from ADC unit 16 is applied to two complex bandedge filters 20 and 22, which are mirror image filters around the Nyquist frequency. Each filter exhibits real and imaginary functions so that output signals from these filters contain real and imaginary components. In FIG. 1, a letter "C" designates those signal paths which convey complex signals with real and imaginary components. Other signal paths convey only real components. Filters 20 and 22 produce output signals without image components, i.e., the output signals contain either positive or negative spectral components but not both. This has the advantage of not generating spurious components that may be difficult to remove subsequently. In this system filters 20 and 22 are designed to have complex analytic output signals with negative spectral components as will be seen from FIG. 2. The negative spectrum is arbitrary; the positive spectrum also could have been chosen.

FIG. 2 depicts the negative frequency spectrum encompassed by the bandpass responses of filters 20 and 22, and by the bandwidth of the received VSB signal as applied to the inputs of filters 20 and 22. The input real signal has positive and negative spectra. The positive spectrum is cancelled using known techniques, leaving the negative spectrum. Filter 20 extracts the upper bandedge of the negative spectrum of the VSB signal, and filter 22 extracts the lower bandedge of the negative spectrum of the VSB signal. The upper bandedge is that which contains the highest frequency components, regardless of whether they are positive or negative components. The lower bandedge is associated with the lowest frequency components. The bandedge responses of filters 20, 22 and the VSB signal intersect at the Nyquist points in this example. In FIG. 2 and subsequent Figures, a symbol "Δ" designates a carrier frequency offset such as may be associated with a near-baseband signal, i.e., a signal not completely frequency shifted to baseband. This offset will be discussed in detail in connection with the carrier recovery (baseband demodulation) network.

The responses of filters 20 and 22 are complementary to the frequency spectrum of the input signal at the bandedge the filters are extracting, as shown in FIG. 2. This has the effect of producing a double sideband suppressed carrier amplitude modulated (AM) signal when no pilot component is present in the received VSB signal (FIG. 3), and producing a double sideband residual carrier AM signal when a pilot is present in that bandedge. The response of filter 20 to the left of frequency $f_1$ is not critical, and the response of filter 22 to the right of frequency $f_2$ is not critical.

Prior to establishing timing and carrier lock, these AM signals contain frequency (and phase) offsets that may be used for timing and carrier recovery. Specifically, the center of the AM signal obtained from the output of upper bandedge filter 20 is situated at $-f_c-¼ f_{st}$. If a pilot signal is present (such as in the Grand Alliance HDTV system), it would appear at this frequency. The frequency $¼ f_{st}$ is one-fourth the symbol frequency if the signal is treated as a VSB signal. Similarly, the center of the AM signal obtained from the output of the lower bandedge filter is situated at $-f_c+¼ f_{st}$ (the Nyquist frequency). Timing synchronization is achieved when the frequency of the sampling clock input (CLK) of ADC unit 16 is four times the frequency difference between the carriers of these two upper and lower suppressed carrier band edge AM signals (FIG. 3).

The timing recovery system operates as follows. The output signal from filter 22 is conjugated by unit 25 to flip the spectrum of the filter 22 output signal from negative to positive. This is illustrated by FIG. 4. Conjugation is a well-known process performed in unit 25 by first separating the signal into its real and imaginary components using well-known methods. The imaginary component is inverted by multiplying it by a negative unity factor. The inverted imaginary component and the original real component are re-combined. The recombined lower bandedge AM signal is multiplied with the upper bandedge AM signal from filter 20 in multiplier 26. An AM signal produced at the output of multiplier 26 has carrier frequency component $f_c$ removed, as illustrated by FIG. 5. Removal of this $f_c$ component results because the negative carrier of the upper bandedge component cancels the positive carrier of the conjugated AM signal from the lower bandedge. The AM signal at a suppressed carrier center frequency of $½ f_{st}$ is maintained because both of the multiplied AM signals are double sideband signals. In the frequency domain these signals are represented at baseband as even functions (i.e., as real only components), and their convolution is represented at baseband as even valued functions.

The bandwidth of the AM output signal from multiplier 26 has been doubled by the convolution process (multiplication in time produces convolution in frequency). By driving every other sample to zero, the frequency of the receiver sampling clock CLK can be synchronized to the symbol frequency of the input VSB signal independent of any carrier offset (Δ). This is accomplished by a phase detector 28 in a timing recovery network 30 as follows.

The imaginary component of the double sideband AM output signal from multiplier 26 (FIG. 5) is an indication of the magnitude of signal mis-timing. The real component indicates the direction of the mis-timing (AM suppressed carrier signals have an ambiguity of 180 degrees which is to be resolved). If this AM signal is perfectly timed, the imaginary component is absent. The double sideband AM signal from multiplier 26 is separated into its constituent real and imaginary components by means of a unit 32 in phase detector 28 using known separation techniques. Using known techniques, a translation unit 34 determines the sign of real component (for direction information), and multiplies this sign by the separated imaginary component samples. The output of multiplier 36 represents an error signal which is driven to zero by the action of the timing control loop when timing lock is achieved.

Since the carrier frequency of the double sideband signal is nominally situated at $½ f_{st}$, at lock of the imaginary component of the output signal from multiplier 36 will be zero. Multiplying the imaginary component with the sign of the real component gives phase detector 28 the ability to differentiate between positive and negative frequency offsets.

The output signal from phase detector 28 is filtered by a low pass loop filter 38 which contains both an integral path and a proportional path, as known, and is clocked at a frequency of $½ f_{sr}$. Loop filter 38 is clocked to process every other sample of the input signal since the purpose of the loop is to drive every other sample of the imaginary component to zero. The output of filter 38 is a DC voltage which is applied to a voltage controlled oscillator (VCO) 40. Oscillator 40 provides the receiver sampling clock CLK for ADC unit 16 as a function of the DC voltage. Timing synchronism is achieved when the ADC sampling clock provided by the described timing recovery system including network 30 is four times the frequency difference between the carriers of the two AM output signals from filters 20 and 22 (FIG. 3). The proportional and integral control portions of filter 38 are adjustable as known by using K1 and K2 gain control scalars respectively. These scalars are set to large values to facilitate signal acquisition in the acquisition mode, and may be reduced in value during the tracking mode to increase noise immunity. The time required to achieve timing lock varies as a function of the amount of noise and multipath distortion present in the signal, the control loop bandwidth, and the control loop time constants, for example.

The carrier can be recovered using two different methods in the system of FIG. 1. One method uses both of the bandedge AM signals from the outputs of filters 20 and 22 in a manner that is similar to that described above for timing recovery. The second method uses only one bandedge of the received signal. In the second case, typically the bandedge which is used is that which may contain the pilot. The extra energy associated with the pilot component enhances the performance of the carrier recovery loop in low signal-to-noise conditions. It is noted, however, that both of these methods advantageously do not require the presence of a pilot component.

The carrier recovery method using both band edges multiplies the outputs of filters 20 and 22 together in a multiplier 45 without conjugating the signal as was done for timing recovery. This multiplication produces a suppressed carrier AM signal at the output of multiplier 45 with a carrier frequency of $-2f_c$. The symbol rate component $f_{sr}$ has been completely removed from this AM signal. If a carrier offset ($\Delta$) exists, the carrier frequency is at $-2f_c-2\Delta$ as depicted in FIG. 6. Up to this point, the carrier recovery process is independent of the receiver demodulator sampling clock frequency, $f_{sr}$.

In digital signal processing applications, it is generally desirable to design voltage controlled oscillators (VCOs) or spectral shifters that conveniently produce signals which are harmonically related to the clock frequency of the digital signal processor. In this regard it is noted that the complex double sideband AM signal at the output of multiplier 45 (FIG. 6) is centered at a frequency of $-2f_c$ (neglecting any carrier offset), or at $-2f_c-2\Delta$ (including the offset). This means that this AM signal is straddling the aliasing foldover region. More specifically, in practice, the left sideband portion of the AM signal shown in FIG. 6 actually "wraps around" into the positive frequency spectrum. Aliasing does not occur because this AM signal is a complex signal in which the adjacent positive frequency component of the first negative repeat band has been removed.

To simplify the design of the carrier recovery network, an associated phase detector 54 is essentially the same as phase detector 28 used in timing recovery network 30. In order to do achieve this, the carrier of the AM input signal to phase detector 54 must be driven to ¼ $f_{sr}$. The carrier of the AM signal input to phase detector 54 is nominally shifted to a frequency of ¼ $f_{sr}$ by using a complex spectral shifter operating at +¼ $f_{sr}$. The spectral shifter comprises complex multipliers 52 and 64. Multiplier 64 responds to a ¼ $f_{sr}$ sampling signal for shifting the output signal of VCO 62 by +¼ $f_{sr}$. The response of VCO 62 is similar to VCO 40 in the timing control loop, and responds to a DC voltage produced by a low pass loop filter 60 which is similar to filter 38 in the timing recovery loop. A resulting complex output signal from multiplier 64, which contains the frequency offset generated by the loop plus the fixed ¼ $f_{sr}$, is applied to an input of complex multiplier 52. The other input of multiplier 52 receives the AM signal centered at $-2f_c$ from the output of complex multiplier 45.

Phase detector 54 operates the same as phase detector 28 in the timing recovery loop. Phase detector 54 includes a real/imaginary component separator 55, a sign function translation network 56, and an output multiplier 57. Phase detector 54 operates by multiplying the imaginary component of the output signal from multiplier 52 with the sign of the real component. This causes the value of every other sample of the imaginary component to be driven to zero. Since phase detector 54, like phase detector 28, operates on the same set of samples (i.e., odd or even, but not both), loop filter 60 (like filter 38) is required to supply output samples at the symbol rate rather than at twice the symbol rate. This significantly reduces the complexity of the loop filters compared to what would be required for 2 sample per symbol implementations.

The output of multiplier 45, at the input to carrier recovery network 50, is a complex double sideband suppressed carrier AM signal centered at a frequency $-2f_c-2\Delta$. The output of VCO 62 in the carrier loop is a signal approximately equal to $2\Delta$. To produce this signal at the output of VCO 62, a signal ¼ $f_{sr}$ is added to the carrier loop via multiplier 64 to cancel the $2f_c$ component. The complex signal $2\Delta$ at the output of VCO 62 is translated to an output signal $\Delta$ of carrier recovery network 50 by means of a divide-by-2 frequency divider 70. Output signal $\Delta$ is a tone (without a frequency spectrum) representing the carrier phase/frequency offset.

The VSB output signal from ADC unit 16 is applied to an input of multiplier 74 after being delayed by a unit 72, which compensates for the signal delay through filters 20 and 22. The output of delay unit 72 is a complex near baseband symmetrical double sideband VSB signal as depicted by the frequency spectrum diagram adjacent to block 72. This signal is shifted to closer to baseband by multiplier 74, which is clocked at ⅛ $f_{sr}$ to produce a near baseband upper VSB sideband at its output, as depicted by the frequency spectra diagram at the output of multiplier 74. The near baseband VSB signal from the output of multiplier 74 is applied to one input of a complex multiplier 71, and the output (offset representative) signal $\Delta$ from the output of carrier recovery network 50 is applied to another input of multiplier 71. The function of multiplier 71 is to substantially cancel the offset $\Delta$ in the VSB signal so that a baseband VSB signal results.

A complex demodulated VSB signal appearing at the output of multiplier 71 should be at baseband and often is. However, in practice this signal may contain residual phase offsets that may have to be compensated for. This is accomplished by an equalizer 75, which may be of a known configuration. Equalizer 75 compensates for channel disturbances as known and produces an equalized output signal that is decoded by unit 76 and processed by an output processor 78. Decoder 76 may include, for example, trellis decoder, de-interleaver, Reed-Solomon error correction, and audio/video decoder networks as known. Output processor 78 may include audio and video processors and audio and video reproduction devices.

Carrier recovery can also be accomplished using a single band edge of the input signal, as follows. Lower band edge filter 22 produces a double sideband AM output signal with a carrier frequency of $-f_c+¼ f_{sr}$. This is accomplished by setting the input to multiplier 45 from filter 20 to a value of unity. This may be done by placing a multiplexer in the signal path between the output of filter 20 and the upper input of multiplier 45. One input of the multiplexer receives the output signal from filter 20, and another input receives a unity value signal. The latter signal is conveyed to the input of multiplier 45 in response to a control signal applied to a control input of the multiplexer. The output signal from upper band edge filter 20 is decoupled from multiplier 45 when the unity value signal is employed. In a system using two band filters, timing and carrier lock may occur at about the same time. In a system using only one band edge filter, carrier lock may occur after timing lock, depending on a variety of factors such as noise, loop gain and loop bandwidth.

If timing lock has been established by network 30, then $f_{st}=¼ f_{sr}$, and the $f_{st}$ component of the carrier can be removed by shifting the AM output signal of filter 22 with a $-⅛ f_{sr}$ spectral shifter. This spectral shifting is accomplished in FIG. 1 by changing the illustrated ¼ $f_{sr}$ clock input to multiplier 64 to a $-⅛ f_{sr}$ clock. After such spectral shifting, the AM signal carrier at the output of multiplier 52 will be at a frequency $-f_c$ (in contrast to $-2f_c$ in the case of the double band edge method discussed previously).

In this embodiment the AM signal carrier frequency fc can be easily driven to $-¼ f_{sr}$ by using a phase detector similar to unit 54 used for the double band edge carrier recovery example and forcing every other sample of the real component to zero. The output of the phase detector is integrated by a low pass loop filter which drives a VCO in a loop which acts to drive the AM signal carrier frequency to $-¼\ f_{sr}$ in a manner analogous to that described above in connection with the double band edge carrier recovery example.

In the described embodiments, timing recovery (lock) may be achieved even in the presence of a carrier offset, and timing lock does not rely on sync components in the VSB signal for this purpose. The choice of operating phase detectors 28 and 54 at the midpoint of the Nyquist region is one possible implementation. However, the phase detectors could also be operated at baseband with the same results. The use of the negative frequency spectrum is arbitrary. The positive spectrum could also have been used with analogous results, by using a different implementation of the described circuits. For example, conjugate filters 20 and 22 would be used and the input to multiplier 64 would be $-¼\ f_{sr}$.

We claim:

1. In a system for receiving a high definition television (HDTV) signal transmitted as a modulated vestigial sideband (VSB) signal formatted as a one-dimensional data constellation of symbols representing digital image data and subject to exhibiting a carrier offset, a timing recovery network for establishing timing synchronism between a local receiver symbol clock and a transmitter symbol clock, said timing recovery network being capable of achieving said synchronism independent of said carrier offset when present in said received signal, said timing recovery network comprising:

an input network (14,16) for receiving said VSB signal;

a filter network responsive to an output signal from said input network, comprising a first band edge filter (20) and a second band edge filter (22) having band edge responses respectively associated with upper and lower band edges of a frequency spectrum of said VSB signal for producing double sideband amplitude modulated (AM) signals at respective outputs of said first and second filters;

a phase detector network (28,38) for processing a double sideband AM output signal from said filter network to produce a control signal representative of a timing error; and a clock signal generator (40) responsive to said control signal for generating said symbol clock.

2. A system according to claim 1, wherein said first and second filters are complex digital filters with responses that are complementary to the frequency spectrum of the VSB input signal at band edges said filters respectively filter.

3. A system according to claim 1, wherein said received VSB signal exhibits a frequency spectrum with band edge responses at a frequencies $f_c-¼\ f_{st}$ and $f_c+¼\ f_{st}$ respectively, with respect to a mid-band carrier frequency $f_c\ +/-\Delta$; and said first filter exhibits a band edge response at a Nyquist frequency $f_c-¼\ f_{st}$ and said second filter exhibits a band edge response at a Nyquist frequency $f_c+¼\ f_{st}$, where $f_c$ is the carrier frequency of said transmitted VSB signal;

$f_{st}$ is the transmitted symbol frequency; and $\Delta$ is a carrier offset when present.

4. A system according to claim 1, wherein said input network includes an analog-to-digital converter (16) for converting a received signal to digital form, said converter being response to said symbol clock.

5. A system according to claim 1 and further including a multiplier (26) having first and second inputs for receiving output signals from said filters, respectively, and an output coupled to an input of said phase detector network.

6. A system according to claim 5, and further including:

means (25) for conjugating one of the output signals from said first and second filters before being applied to said multiplier.

7. A system according to claim 5, wherein an output signal of said multiplier is a suppressed carrier double sideband AM signal centered around a frequency $½\ f_{st}$, where $f_{st}$ is the transmitted symbol frequency.

8. A system according to claim 1, wherein input signal to said phase detector network is a complex signal having real and imaginary components; and said phase detector network includes means for cancelling said imaginary component in an output signal from said phase detector network.

9. A system according to claim 1, wherein said received VSB signal is an 8-VSB signal having a one dimensional data symbol constellation defined by the following eight data symbols: $-7\ -5\ -3\ -1\ 1\ 3\ 5\ 7$.

10. In a system for receiving a high definition television (HDTV) signal transmitted as a vestigial sideband (VSB) modulated signal formatted as a one-dimensional data constellation of symbols representing digital image data, apparatus comprising:

an input network (14,16) for receiving said VSB signal;

a filter network responsive to an output signal from said input network, comprising a first band edge filter (20) and a second band edge filter (22) having band edge responses respectively associated with upper and lower band edges of a frequency spectrum of said VSB signal for producing double sideband amplitude modulated (AM) signals at respective outputs of said first and second filters;

a timing recovery network (30) responsive to output signals from said first and second filters for establishing timing synchronism between a local receiver symbol clock and a transmitter symbol clock; and a carrier recovery network (50) responsive to output signals from said first and second filters for frequency shifting said received VSB signal toward baseband.

11. A system according to claim 10, wherein said first and second filters are digital filters with responses that are complementary to the frequency spectrum of said input VSB signal at band edges said filters respectively filter.

* * * * *

UNITED STATES PATENT AND TRADEMARK OFFICE
CERTIFICATE OF CORRECTION

PATENT NO. : 5,805,242
DATED : September 8, 1998
INVENTOR(S) : Christopher Hugh Strolle and Steven Todd Jaffe It is certified that error appears in the above-identified patent and that said Letters Patent is hereby corrected as shown below:

<u>Title page,</u>
Item [73], Assignee, delete "Thomson Consumer Electronics, Inc., Indianapolis, Ind.", and add -- RCA Thomson Licensing Corporation, Princeton, New Jersey --

Signed and Sealed this

Second Day of April, 2002

*Attest:*

JAMES E. ROGAN
*Attesting Officer*   *Director of the United States Patent and Trademark Office*